United States Patent
Kim et al.

(10) Patent No.: US 11,519,953 B2
(45) Date of Patent: Dec. 6, 2022

(54) APPARATUS FOR TESTING SEMICONDUCTOR DEVICE

(71) Applicant: SAMSUNG ELECTRONICS CO., LTD., Suwon-si (KR)

(72) Inventors: Min Woo Kim, Cheonan-si (KR); Seung Bin Ko, Asan-si (KR); Dong Joo Roh, Cheonan-si (KR); Chang Ho Lee, Asan-si (KR); Jin-Ho Choi, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 133 days.

(21) Appl. No.: 16/875,065

(22) Filed: May 15, 2020

(65) Prior Publication Data
US 2021/0109149 A1  Apr. 15, 2021

(30) Foreign Application Priority Data

Oct. 10, 2019 (KR) .................. 10-2019-0125267

(51) Int. Cl.
| | |
|---|---|
| G01R 31/26 | (2020.01) |
| G01R 31/28 | (2006.01) |
| G01R 1/04 | (2006.01) |
| G01R 1/067 | (2006.01) |
| G01R 1/073 | (2006.01) |

(52) U.S. Cl.
CPC .......... *G01R 31/2601* (2013.01); *G01R 1/04* (2013.01)

(58) Field of Classification Search
CPC ........ G01R 31/02; G01R 31/26; G01R 31/28; G01R 1/04; G01R 1/067; G01R 1/073
See application file for complete search history.

(56) References Cited

U.S. PATENT DOCUMENTS

| | | | |
|---|---|---|---|
| 5,359,285 A | * | 10/1994 | Hashinaga ......... G01R 31/2874 324/750.08 |
| 6,717,115 B1 | | 4/2004 | Pfahnl et al. |
| 7,554,349 B2 | | 6/2009 | Kang et al. |

(Continued)

FOREIGN PATENT DOCUMENTS

| | | |
|---|---|---|
| KR | 10-0781336 | 11/2007 |
| KR | 10-0785741 | 12/2007 |

(Continued)

*Primary Examiner* — Neel D Shah
(74) *Attorney, Agent, or Firm* — F. Chau & Associates, LLC

(57) ABSTRACT

An apparatus for testing a semiconductor device is described. The apparatus includes a test chamber in which a test process for a plurality of semiconductor devices is performed, a first storage disposed in the test chamber with a first semiconductor device located therein, a second storage spaced apart in a first direction from the first storage with a second semiconductor device located therein, a first nozzle extending in the first direction on a first sides of the first and second storages and including a plurality of first air outlets configured to discharge air, a second nozzle extending in the first direction on and including a plurality of second air outlets configured to discharge air, and a controller controlling temperatures of the first and second semiconductor devices within a predefined temperature range by controlling the air discharged by the first and second nozzles.

20 Claims, 12 Drawing Sheets

(56) References Cited

U.S. PATENT DOCUMENTS 9,207,272 B2 * 12/2015 Oh .................... G01R 31/2865
2020/0166562 A1 * 5/2020 Ishida ................ G01R 31/2849

FOREIGN PATENT DOCUMENTS

| KR | 10-0819836 | 4/2008 |
|----|---|---|
| KR | 10-2008-0040490 | 5/2008 |
| KR | 10-0866537 | 10/2008 |
| KR | 10-2014-0135876 | 11/2014 |
| KR | 10-2014-0147902 | 12/2014 |
| KR | 10-2016-0129540 | 11/2016 |
| KR | 10-2016-0138818 | 12/2016 |
| KR | 10-2018-0028882 | 3/2018 |
| KR | 10-1919087 | 11/2018 |
| KR | 10-2019-0010398 | 1/2019 |
| KR | 10-1936348 | 1/2019 |
| KR | 10-1951206 | 2/2019 |
| KR | 10-1958242 | 3/2019 |

* cited by examiner

APPARATUS FOR TESTING SEMICONDUCTOR DEVICE

This application claims priority to Korean Patent Application No. 10-2019-0125267, filed on Oct. 10, 2019, and all the benefits accruing therefrom under 35 U.S.C. § 119, the disclosure of which is incorporated by reference herein in its entirety.

BACKGROUND

1. Technical Field

The present disclosure relates to an apparatus for testing a semiconductor device.

2. Description of the Related Art

Semiconductor devices are used in everyday items such as cell phones, tables, and personal computers. During manufacturing, a semiconductor device may be tested for manufacturing defects. In some cases, a current is supplied to the semiconductor and, as a result, temperatures of the semiconductor increase.

Damage to the semiconductor is possible due to the temperature increases from the test. The damage may lead to an unusable device. As a result, ambient temperature control methods and devices may be used to reduce the temperature of the semiconductor. The ambient temperature control methods and devices may change a temperature of a testing chamber to control the temperature of the semiconductor.

SUMMARY

Embodiments of the present disclosure provide an apparatus for testing a semiconductor device, which can effectively control the temperature of the semiconductor device by releasing air directly to the semiconductor device using a plurality of nozzles disposed in a test chamber.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided an apparatus for testing a semiconductor device, comprising a test chamber in which a test process for a plurality of semiconductor devices is performed, a first storage disposed in the test chamber with a first semiconductor device located therein, a second storage spaced apart in a first direction from the first storage with a second semiconductor device located therein, a first nozzle extending in the first direction on a first side of the first and a first side of the second storage and including a plurality of first air outlets configured to discharge air, a second nozzle extending in the first direction on a second side of the first and a second side of the second storage and including a plurality of second air outlets configured to discharge air, and a controller controlling temperatures of the first and second semiconductor devices within a predefined temperature range by controlling the air discharged by the first and second nozzles.

According to an embodiment of the present disclosure, there is provided an apparatus for testing a semiconductor device, comprising a test chamber in which a test process for a plurality of semiconductor devices is performed, a first storage disposed in the test chamber with a first semiconductor device located therein, a first nozzle extending in the first direction on a first side of the first storage and providing air directly to the first semiconductor device, a second nozzle extending in the first direction on a second side of the first storage and providing air directly to the first semiconductor device, a heater heating the inside of the test chamber, a cooler cooling the inside of the test chamber, a chiller providing air cooled with a first coolant with a first coolant temperature to the first and second nozzles, and a controller controlling temperature of the first semiconductor device within a predefined temperature range by controlling the heater, the cooler, and the chiller.

According to an embodiment of the present disclosure, there is provided an apparatus for testing a semiconductor device, comprising a test chamber in which a test process for a plurality of semiconductor devices is performed, a first storage disposed in the test chamber with a first semiconductor device located therein, a second storage spaced apart in the first direction from the first storage with a second semiconductor device located therein, a third storage spaced apart in a second direction, which is different from the first direction, from the first storage with a third semiconductor device located therein, a first nozzle extending in the first direction on a first side of the first and a first side of the second storage and including a plurality of first air outlets configured to discharge air, a second nozzle extending in the first direction on a second side of the first and a second side of the second storage and including a plurality of second air outlets configured to discharge air, a third nozzle extending in the first direction on a first side of the third storage and including a plurality of third air outlets configured to discharge air, a fourth nozzle extending in the first direction on a second side of the third storage and including a plurality of fourth air outlets configured to discharge air, a heater heating the inside of the test chamber, a cooler cooling the inside of the test chamber, a chiller providing air cooled with a first coolant with a first coolant temperature to the first through fourth nozzles, and a controller controlling temperatures of the first through third semiconductor devices within a predefined temperature range by controlling the heater, the cooler, and the chiller.

According to an embodiment of the present disclosure, a method is described that includes measuring the temperature of a semiconductor device; determining that the temperature of the semiconductor device is outside of a pre-defined test range based on the measuring; and adjusting a temperature of the test chamber based on the determination by discharging air through a plurality of nozzles located on at least two sides of the semiconductor device.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

The present disclosure provides systems and methods for temperature control during semiconductor testing. Ambient temperature control of a testing chamber can impact the temperature of the semiconductor after a time delay. Therefore, the present disclosure describes semiconductor testing temperature control methods that sense the temperature of the semiconductor and apply temperature control measures based on the sensed temperature.

In some embodiments, damage to a semiconductor caused by high temperatures may be prevented by controlling the temperature using one or more air nozzles in the test chamber. For example, structures used to control the temperature of the semiconductors may be disposed inside the test chamber, and one or more air nozzle may extend parallel to the semiconductor. The air nozzles provide a user-defined flow of air to the semiconductor during testing.

Embodiments of the present disclosure provide a temperature sensing method, that senses the temperature of the semiconductor directly, rather than the temperature of the test chamber. This provides the user a more accurate representation of the semiconductor temperature, resulting in a reduction in temperature-related damage.

In some cases, reducing test time may also improve the productivity of testing for semiconductor devices. However, as the integration density of memories increases, the amount of time for testing memories may also increase. In order to improve test qualities, automated handling can help make full use of testing and minimize idle time. In some cases, parallel testing enables the testing of multiple devices with a single tester.

According to various embodiments, a test handler is a handling device that establishes an appropriate temperature and environment for testing a semiconductor device or a module in a test process, automatically transports the semiconductor device or module to a testing location for an electrical test, automatically plug the semiconductor device or module in, or out of, a socket electrically connected to a tester, determines whether the semiconductor device or module is defective based on test results by communicating with the tester, and automatically classifies and stores the semiconductor device or module based on the results of the determination.

An apparatus for testing a semiconductor device according to some embodiments of the present disclosure will hereinafter be described with reference to FIGS. 1 through 7.

Figure 1:
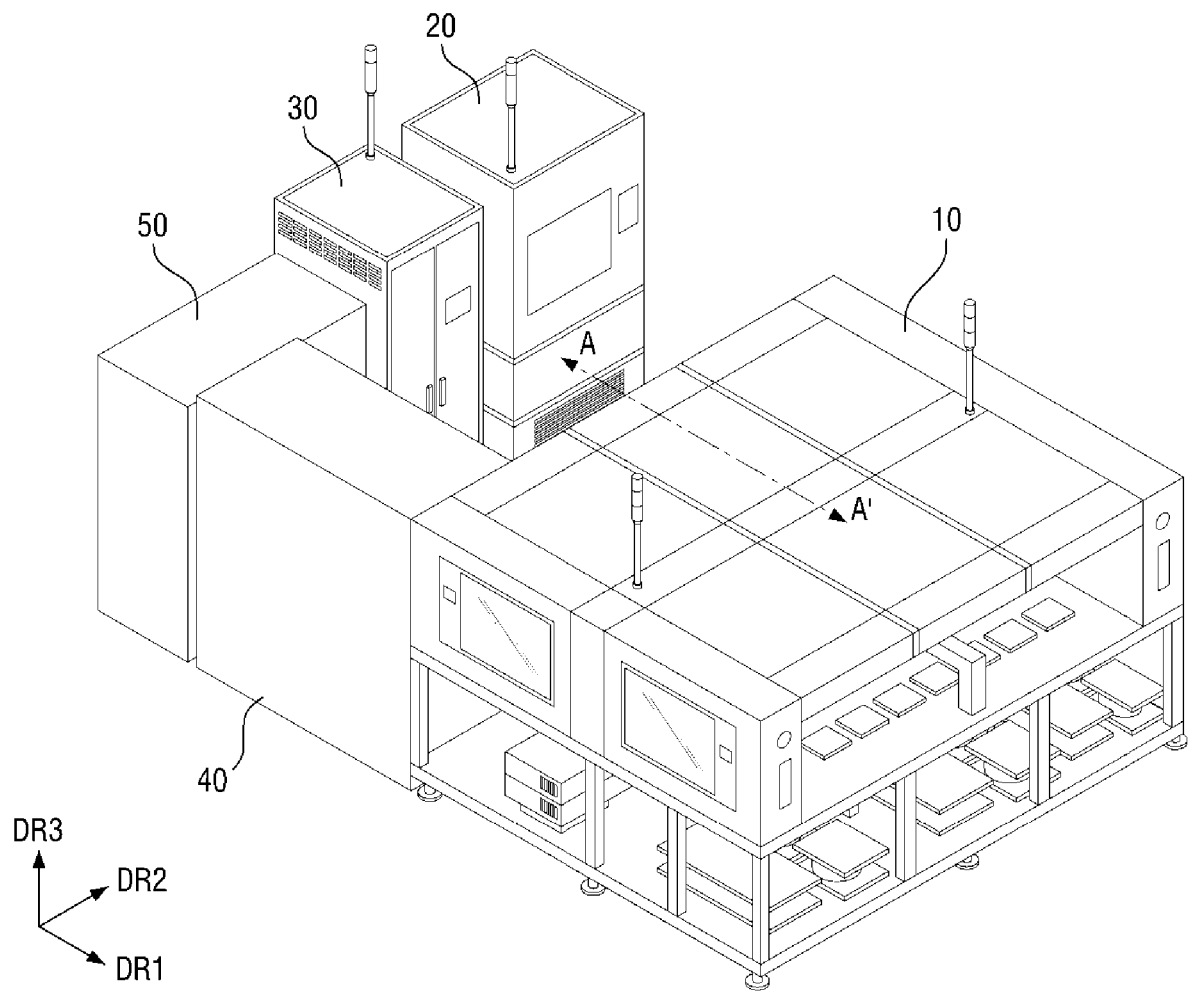
FIG. 1 is a perspective view of an apparatus for testing a semiconductor device according to some embodiments of the present disclosure.
Figure 2:
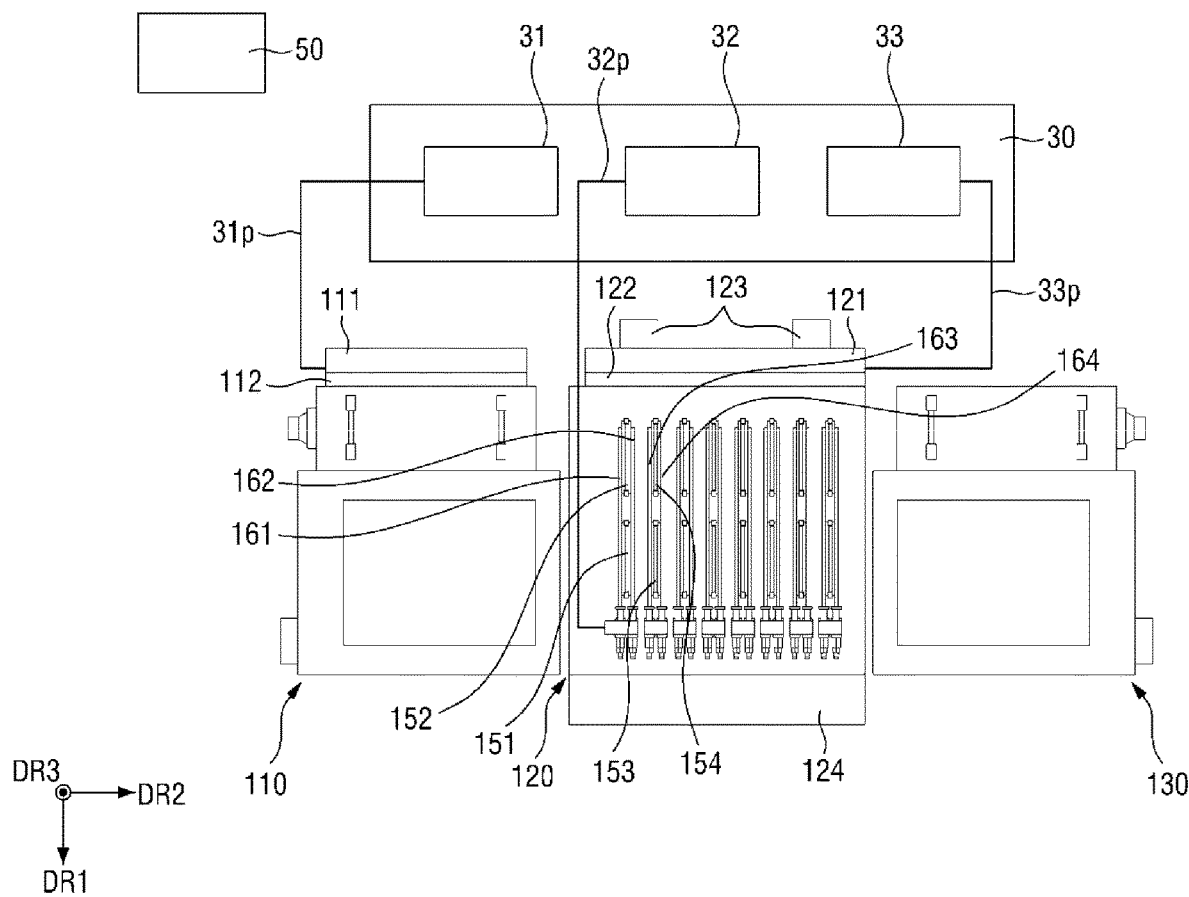
FIG. 2 is a plan view illustrating the internal structure of the apparatus of FIG. 1.
Figure 3:
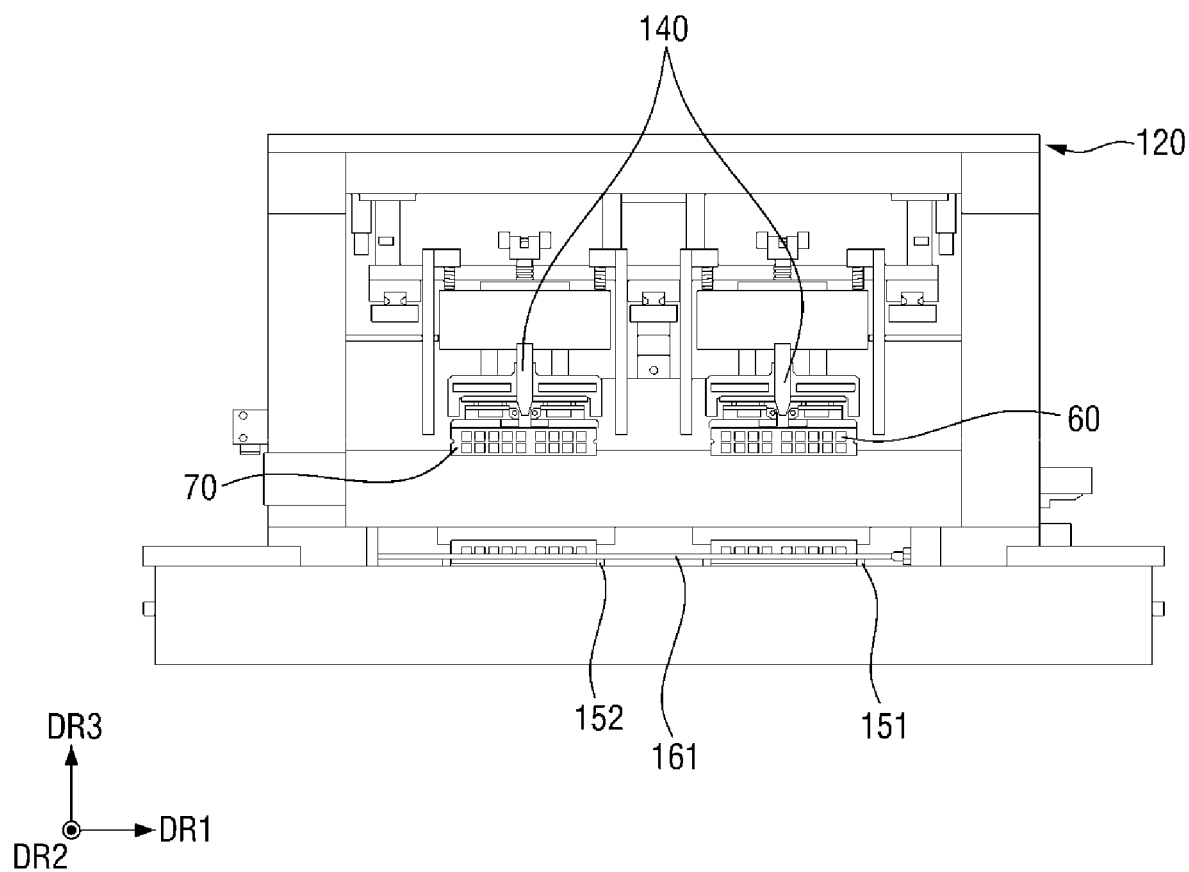
FIG. 3 is a side view of a test chamber according to some embodiments of the present disclosure.
Figure 4:
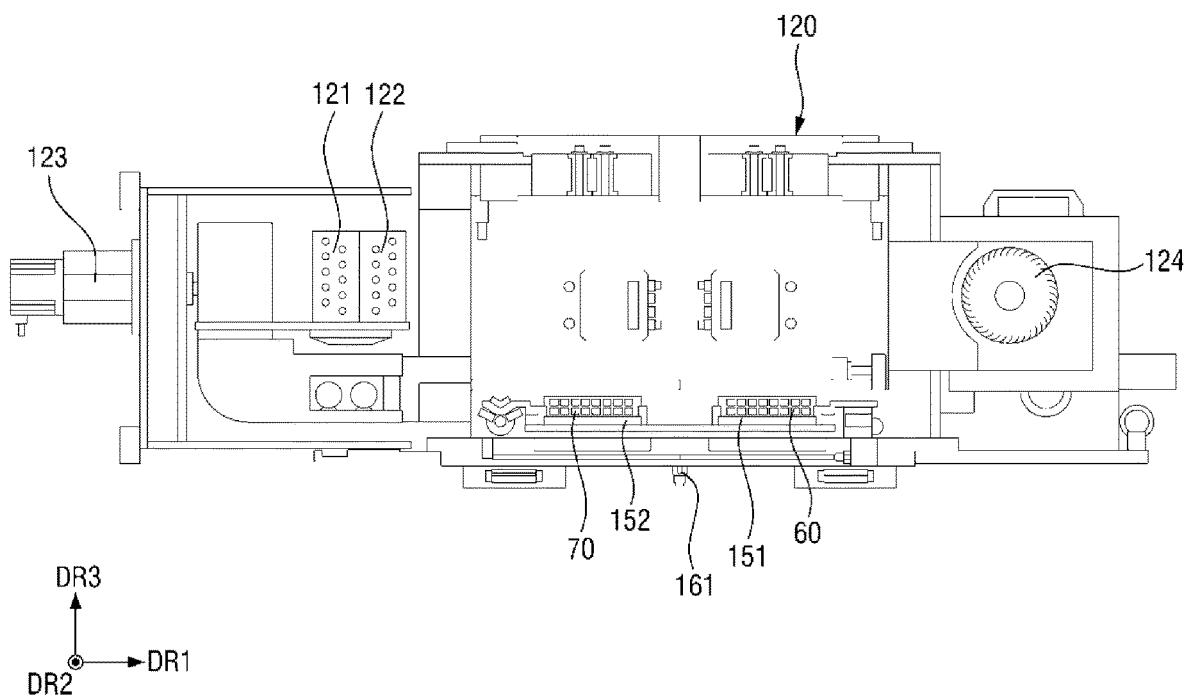
FIG. 4 is a cross-sectional view taken along line A-A' of FIG. 1.
Figure 5:
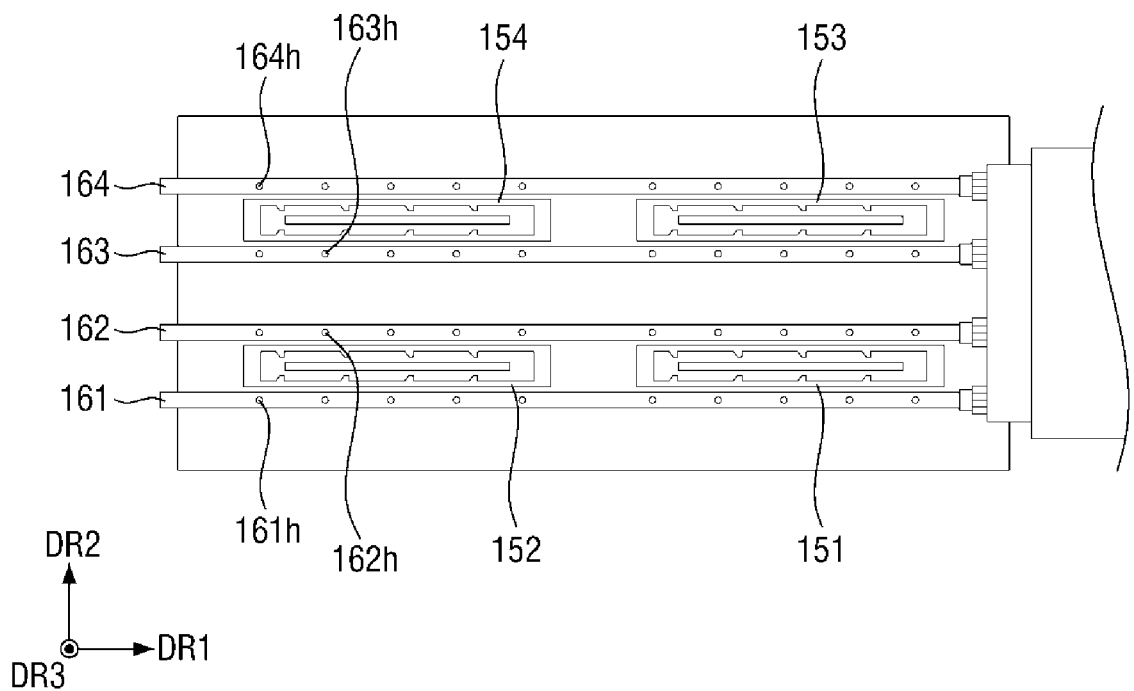
FIG. 5 is a plan view illustrating nozzles disposed in the apparatus of FIG. 1.
Figure 6:
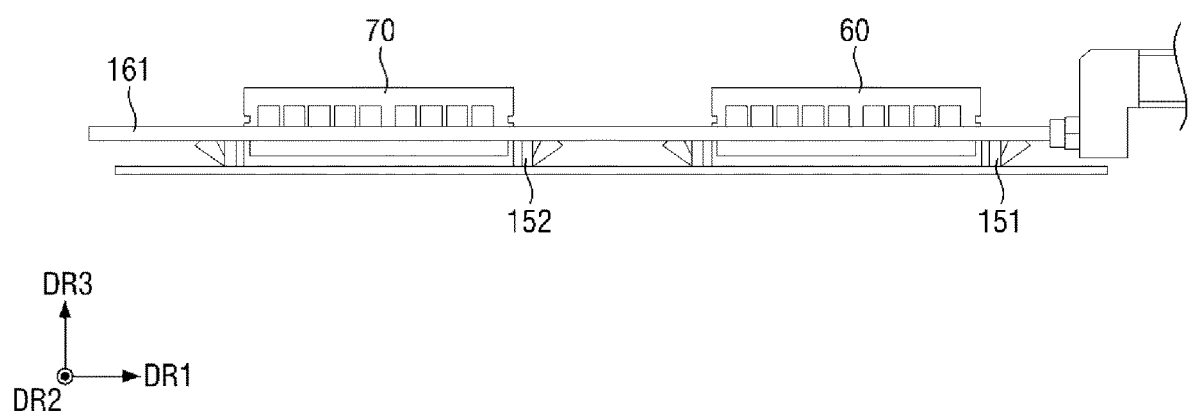
FIG. 6 is a side view illustrating the nozzles of FIG. 5.
Figure 7:
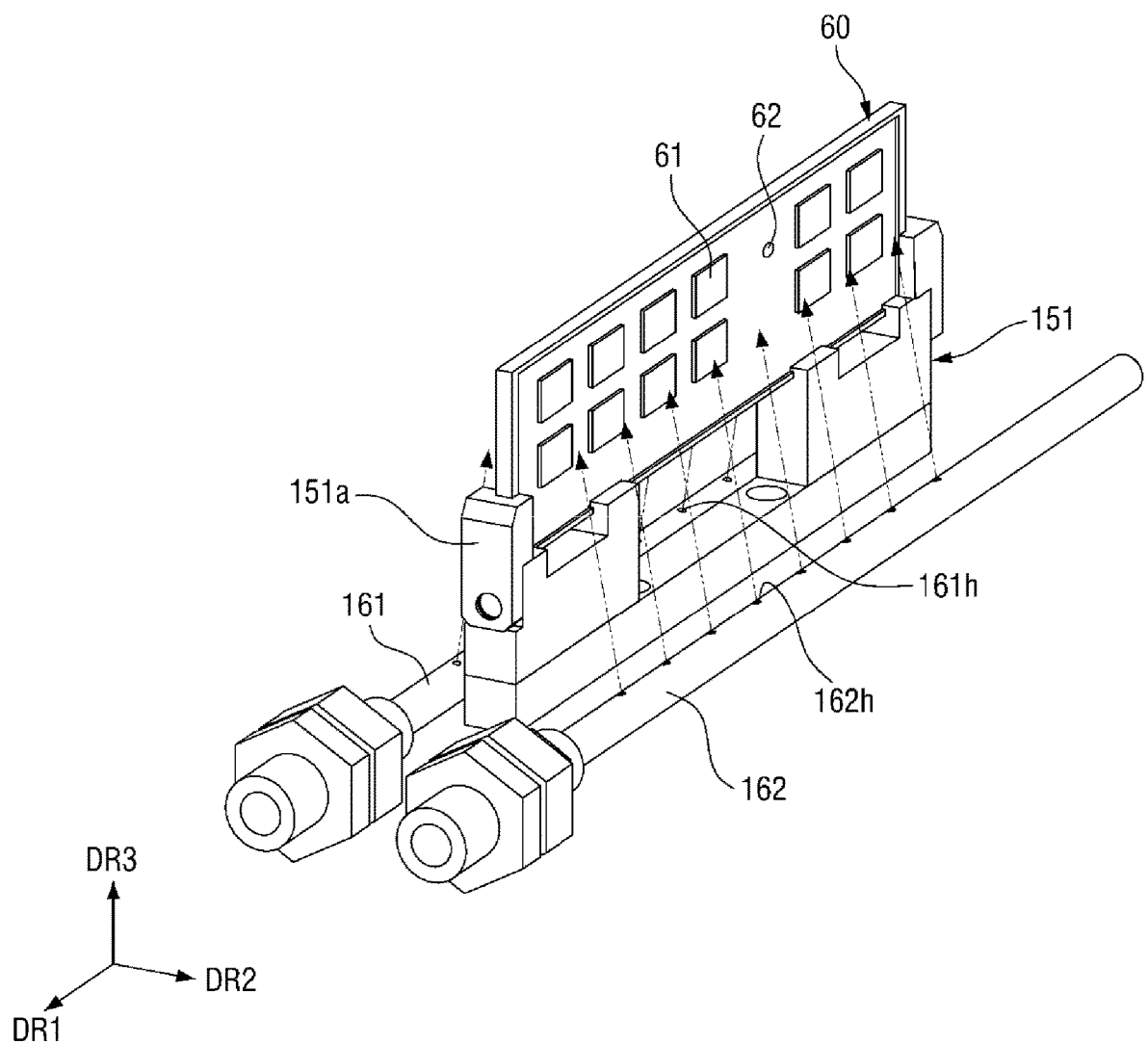
FIG. 7 is a perspective view illustrating the nozzles and a storage disposed in the apparatus of FIG. 1.

FIG. 1 is a perspective view of an apparatus for testing a semiconductor device according to some embodiments of the present disclosure. FIG. 2 is a plan view illustrating the internal structure of the apparatus of FIG. 1. FIG. 3 is a side view of a test chamber according to some embodiments of the present disclosure. FIG. 4 is a cross-sectional view taken along line A-A' of FIG. 1. FIG. 5 is a plan view illustrating nozzles disposed in the apparatus of FIG. 1. FIG. 6 is a side view illustrating the nozzles of FIG. 5. FIG. 7 is a perspective view illustrating the nozzles and storage disposed in the apparatus of FIG. 1.

Referring to FIGS. 1 through 7, the apparatus includes a main body 10, a tester 20, a chiller 30, a power supply 40, and a controller 50.

A test process for a plurality of semiconductor devices 60 and 70 may be performed in the main body 10. The tester 20 may calculate data by analyzing information regarding a test process being performed in the main body 10. The tester 20 is illustrated in FIG. 1 as being disposed outside the main body 10, but the present disclosure is not limited thereto.

The chiller 30 may be connected to the main body 10. The chiller 30 may provide a first coolant to a soak chamber 110. The chiller 30 may also provide cool air or a second coolant to a test chamber 120, and will be described later in detail.

The controller 50 may control the temperature inside the soak chamber 110 by controlling a first coolant supply 31, a first cooler 111, and a first heater 112 of the chiller 30. The controller 50 may control the temperature inside the test chamber 120 by controlling a cool air supply 32, a second coolant supply 33, a second cooler 121, and a second heater 122 of the chiller 30. The controller 50 will be described in detail.

The power supply 40 may supply power to each of the main body 10, the tester 20, the chiller 30, and the controller 50.

The main body 10 may include the soak chamber 110, the test chamber 120, and an exit chamber 130.

The soak chamber 110 may be disposed on one side of the test chamber 120. The first cooler 111 and the first heater 112 may be connected to the soak chamber 110. FIG. 2 illustrates that the first cooler 111 and the first heater 112 are disposed to be in contact with each other. The locations of the first cooler 111 and the first heater 112 are not particularly limited.

The first cooler 111 may provide air that may be cooled using the first coolant provided from the chiller 30 to the inside of the soak chamber 110. In this case, the first coolant supply 31 of the chiller 30 may provide the first coolant with a temperature of, for example, −40° C., to the first cooler 111 through a first coolant supply tube 31p. The first cooler 111 may lower the temperature inside the soak chamber 110.

The first heater 112 may heat air and may provide the heated air to the inside of the soak chamber 110. The first heater 112 may raise the temperature inside the soak chamber 110.

The soak chamber 110 may provide the plurality of semiconductor devices 60 and 70 to the test chamber 120. The soak chamber 110 may adjust the temperature of the plurality of semiconductor devices 60 and 70 in advance based on the temperature of a test process to be performed in the test chamber 120.

For example, if the temperature of the test process is 80° C. or higher, the controller 50 may control the first heater 112 to raise the temperature inside the soak chamber 110. As a result, the plurality of semiconductor devices 60 and 70 in the soak chamber 110 may be heated to a temperature of 80° C. However, the present disclosure is not limited to this example. In other embodiments, if the temperature of the test process is 80° C. or higher, the plurality of semiconductor devices 60 and 70 in the soak chamber 110 may be heated to a temperature of, for example, 70° C.

The plurality of semiconductor devices 60 and 70 heated to a temperature of 80° C. in the soak chamber 110 may be provided to the test chamber 120.

For example, if the temperature of the test process is −20° C. or lower, the controller 50 may control the chiller 30 to lower the temperature inside the soak chamber 110 via the first cooler 111. As a result, the plurality of semiconductor devices 60 and 70 in the soak chamber 110 may be cooled to a temperature of −20° C. However, the present disclosure is not limited to this example. In other embodiments, if the temperature of the test process is −20° C. or higher, the plurality of semiconductor devices 60 and 70 in the soak chamber 110 may be cooled to a temperature of −10° C.

The plurality of semiconductor devices 60 and 70 cooled to a temperature of −20° C. in the soak chamber 110 may be provided to the test chamber 120.

The exit chamber 130 may be disposed on the other side of the test chamber 120. The plurality of semiconductor devices 60 and 70 that have completed a test process in the test chamber 120 may be provided to the exit chamber 130.

The exit chamber 130 may adjust the temperature of the plurality of semiconductor devices 60 and 70 provided from the test chamber 120. For example, the exit chamber 130 may cool the plurality of semiconductor devices 60 and 70 heated to a temperature of 80° C. or higher. In another example, the exit chamber 130 may heat the plurality of semiconductor devices 60 and 70 cooled to a temperature of −20° C. or lower.

The test chamber 120 may be disposed between the soak chamber 110 and the exit chamber 130. A test process may be performed on the plurality of semiconductor devices 60 and 70 in the test chamber 120.

The test chamber 120 may include a plurality of storages, a plurality of nozzles, the second cooler 121, the second heater 122, first fans 123, a second fan 124, and a semiconductor device supply 140.

The plurality of storages may be disposed in the test chamber 120 to be spaced apart from one another in first and second directions DR1 and DR2. As illustrated in FIG. 2, a total of 16 storages may be disposed in the test chamber 120 in two rows in the first direction DR1 and in eighth rows in the second direction DR2 to be spaced apart from one another. The present disclosure is not limited thereto.

Four of the plurality of storages that are disposed to be spaced apart from one another in the first and second directions DR1 and DR2 will hereinafter be described as an example.

For example a first storage 151, a second storage 152, a third storage 153, and a fourth storage 154 may be disposed in the test chamber 120. The second storage 152 may be spaced apart in the first direction DR1 from the first storage 151. The third storage 153 may be spaced apart in the second direction DR2 from the first storage 151. The fourth storage 154 may be spaced apart in the first direction DR1 from the second storage 152.

The first through fourth storages 151 through 154 may extend in the first direction DR1. The plurality of semiconductor devices 60 and 70 may be disposed in the first through fourth storages 151 through 154.

The plurality of semiconductor devices 60 and 70 may be moved in a third direction DR3 via the semiconductor device supply 140, which is installed on the first through fourth storages 151 through 154. Therefore, the plurality of semiconductor devices 60 and 70 may be placed on the first through fourth storages 151 through 154. For example, a first semiconductor device 60 may be placed on the first storage 151, and a second semiconductor device 70 may be placed on the second storage 152.

The plurality of semiconductor devices 60 and 70 may be fixed to the first through fourth storages 151 through 154 by fixing parts, which are installed at the first through fourth storages 151 through 154. For example, as illustrated in FIG. 7, the first semiconductor device 60 may be fixed to the first storage 151 by a fixing part 151a, which is installed at the first storage 151.

Each of the plurality of semiconductor devices 60 and 70 may include a plurality of semiconductor chips and a temperature sensor. For example, as illustrated in FIG. 7, the first semiconductor device 60 may include a plurality of semiconductor chips 61 and a temperature sensor 62. The temperature of the first semiconductor device 60 may be sensed by the temperature sensor 62.

The plurality of nozzles may be disposed in the test chamber 120 to be spaced apart from one another in the second direction DR2. As illustrated in FIG. 2, the plurality of nozzles may be disposed to extend in the first direction DR1 on both sides of each of the plurality of storages.

Four nozzles spaced apart from one another in the second direction DR2 will hereinafter be described as an example. In an example, first through fourth nozzles 161 through 164 may be disposed in the test chamber 120. Additionally, first through fourth nozzles 161 through 164 may be spaced apart from one another in the second direction DR2.

The first nozzle 161 may extend in the first direction DR1 on first sides of the first and second storages 151 and 152. As illustrated in FIG. 5, the first nozzle 161 may include a plurality of first air outlets 161h that may be arranged in a row in the first direction DR1 to be spaced apart from one another. The first air outlets 161h may be disposed on the first sides of the first and second storages 151 and 152.

The second nozzle 162 may extend in the first direction DR1 on second sides of the first and second storages 151 and 152 that are opposite of the first sides of the first and second storages 151 and 152. The second nozzle 162 may include a plurality of second air outlets 162h that may be arranged in a row in the first direction DR1 to be spaced apart from one another. The second air outlets 162h may be disposed on the second side of the first and second storages 151 and 152.

The third nozzle 163 may extend in the first direction DR1 on first sides of the third and fourth storages 153 and 154. The third nozzle 163 may include a plurality of third air outlets 163h that may be arranged in a row in the first direction DR1 to be spaced apart from one another. The third nozzle 163 may be disposed on the first sides of the third and fourth storages 153 and 154.

The fourth nozzle 164 may extend in the first direction DR1 on second sides of the third and fourth storages 153 and 154 that are opposite of the first sides of the third and fourth storages 153 and 154. The fourth nozzle 164 may include a plurality of fourth air outlets 164h. Additionally, the plurality of fourth air outlets 164h may be arranged in a row in the first direction DR1 to be spaced apart from one another. The fourth air outlets 164h may be disposed on the second sides of the third and fourth storages 153 and 154.

Each of the plurality of nozzles may discharge air directly to a corresponding semiconductor device via a plurality of air outlets thereof. For example, as illustrated in FIG. 7, the first nozzle 161 may discharge air directly to a first surface of the first semiconductor device 60 via the first air outlets 161h. Additionally, the second nozzle 162 may discharge air directly onto a second surface of the first semiconductor device 60 that may be opposite of the first surface of the first semiconductor device 60 via the second air outlets 162h.

The air outlets of each of the plurality of nozzles may discharge air at an inclined angle with respect to the corresponding semiconductor device. For example, as illustrated in FIG. 7, the first air outlets 161h may discharge air at an inclined angle with respect to the first surface of the first semiconductor device 60, and the second air outlets 162h may discharge air at an inclined angle with respect to the second surface of the first semiconductor device 60.

The temperature of the corresponding semiconductor device can be controlled with the air outlets of each of the plurality of nozzles discharging air at an inclined angle directed at a corresponding semiconductor device.

The controller 50 may control the temperature of the first and second semiconductor devices 60 and 70 in the test chamber 120 within a predefined temperature range.

In a case where a test process is performed at a temperature of 80° C. or higher, the controller 50 may control the temperature of the first and second semiconductor devices 60 and 70 within the range from a first device temperature to a second device temperature. In this case, for example, an appropriate testing temperature may be, for example, 85° C. Additionally, the first device temperature may be, for example, 82° C., and the second device temperature may be, for example, 88° C. However, the present disclosure is not limited to this example.

In a case where a test process is performed at a temperature of −20° C. or lower, the controller 50 may control the temperature of the first and second semiconductor devices 60 and 70 within the range from a third device temperature to a fourth device temperature. In this case, for example, an appropriate testing temperature may be, for example, −25° C. Additionally, the third device temperature may be, for example, −28° C., and the fourth device temperature may be, for example 22° C. However, the present disclosure is not limited to this example.

The controller 50 may provide cool air to the first through fourth nozzles 161 through 164 by controlling the cool air supply 32 of the chiller 30. The cool air supply 32 may generate cool air by cooling air with the second coolant with a first coolant temperature. The first coolant temperature may be, for example, −35° C., but the present disclosure is not limited thereto.

The cool air generated by the cool air supply 32 may have a temperature of, for example, 10° C., but the present disclosure is not limited thereto.

The cool air generated by the cool air supply 32 may be provided to each of the first through fourth nozzles 161 through 164 through a cool air supply tube 32p. The cool air provided to the first through fourth nozzles 161 through 164 may be provided directly to the first and second semiconductor devices 60 and 70 via the first air outlets 161h, the second air outlets 162h, the third air outlets 163h, and the fourth air outlets 164h.

For example, in a case where a test process is performed at a temperature of 80° C. or higher, 10° C. cool air generated by the cool air supply 32 may lower the temperature of the first and second semiconductor devices 60 and 70. In a case where a test process is performed at a temperature of −20° C. or lower, the 10° C. cool air generated by the cool air supply 32 may raise the temperature of the first and second semiconductor devices 60 and 70.

The controller 50 may provide a third coolant to the second cooler 121 by controlling the second coolant supply 33 of the chiller 30. The third coolant from the second coolant supply 33 may be provided to the second cooler 121 via a second coolant supply tube 33p.

The second coolant supply 33 may provide a third coolant with a second coolant temperature that may be lower than the first coolant temperature, to the second cooler 121. The second coolant temperature may be, for example, −40° C., but the present disclosure is not limited thereto.

The second cooler 121 may lower the temperature inside the test chamber 120 using the third coolant provided by the second coolant supply 33.

For example, in a case where a test process is performed at a temperature of −20° C. or lower, the second cooler 121 may lower the temperature of the first and second semiconductor devices 60 and 70 by lowering the temperature inside the test chamber 120 using the third coolant.

The controller 50 may raise the temperature inside the test chamber 120 by controlling the second heater 122. For example, in a case where a test process is performed at a temperature of 80° C. or higher, the second heater 122 may raise the temperature inside the test chamber 120 and may thus raise the temperature of the first and second semiconductor devices 60 and 70.

The first fans 123 may be disposed on a first side of the test chamber 120, where the second cooler 121 and the second heater 122 are disposed. FIG. 2 illustrates that two first fans 123 are provided, but the present disclosure is not limited thereto.

The first fans 123 may provide the air cooled by the second cooler 121 or the air heated by the second heater 122 to the first and second semiconductor devices 60 and 70.

The second fan 124 may be disposed on a second side of the test chamber 120 that may be opposite of the first side of the test chamber 120 where the first fans 123 are disposed. The second fan 124 may provide the cooled or heated air provided by the first fans 123 to the first fans 123.

The controller 50 may circulate the air cooled by the second cooler 121 or the air heated by the second heater 122 inside the test chamber 120 by controlling the first fans 123 and the second fan 124.

According to an embodiment of the present disclosure, a method of controlling the temperature of a semiconductor includes measuring the temperature of a semiconductor device; determining that the temperature of the semiconductor device is outside of a pre-defined test range based on the measuring; and adjusting a temperature of the test chamber based on the determination by discharging air through a plurality of nozzles located on at least two sides of the semiconductor device. According to some embodiments, the temperature of the semiconductor device may be measured directly (as opposed to measuring the temperature of the test chamber.

In some cases, the temperature of the semiconductor device is above a pre-defined test range, and the method includes providing air having a temperature below the temperature of the semiconductor device to the plurality of nozzles. In some cases, the temperature of the semiconductor device is below a pre-defined test range, and the method includes providing air having a temperature above the temperature of the semiconductor device to the plurality of nozzles.

In some cases, the plurality of nozzles includes a first nozzle located on a first side of the semiconductor device, and a second nozzle located on a second side of the semiconductor device and separated from the first nozzle in a first direction, and where each of the plurality of nozzles has a plurality of air outlets separated from each other in a second direction perpendicular to the first direction.

In some cases, the method includes setting a temperature of a soak chamber within the test range and moving the semiconductor device from the soak chamber to the test chamber.

A temperature control method of the apparatus for testing a semiconductor device according to some embodiments of the present disclosure will hereinafter be described with reference to FIGS. 2, 8, and 9.

Figure 8:
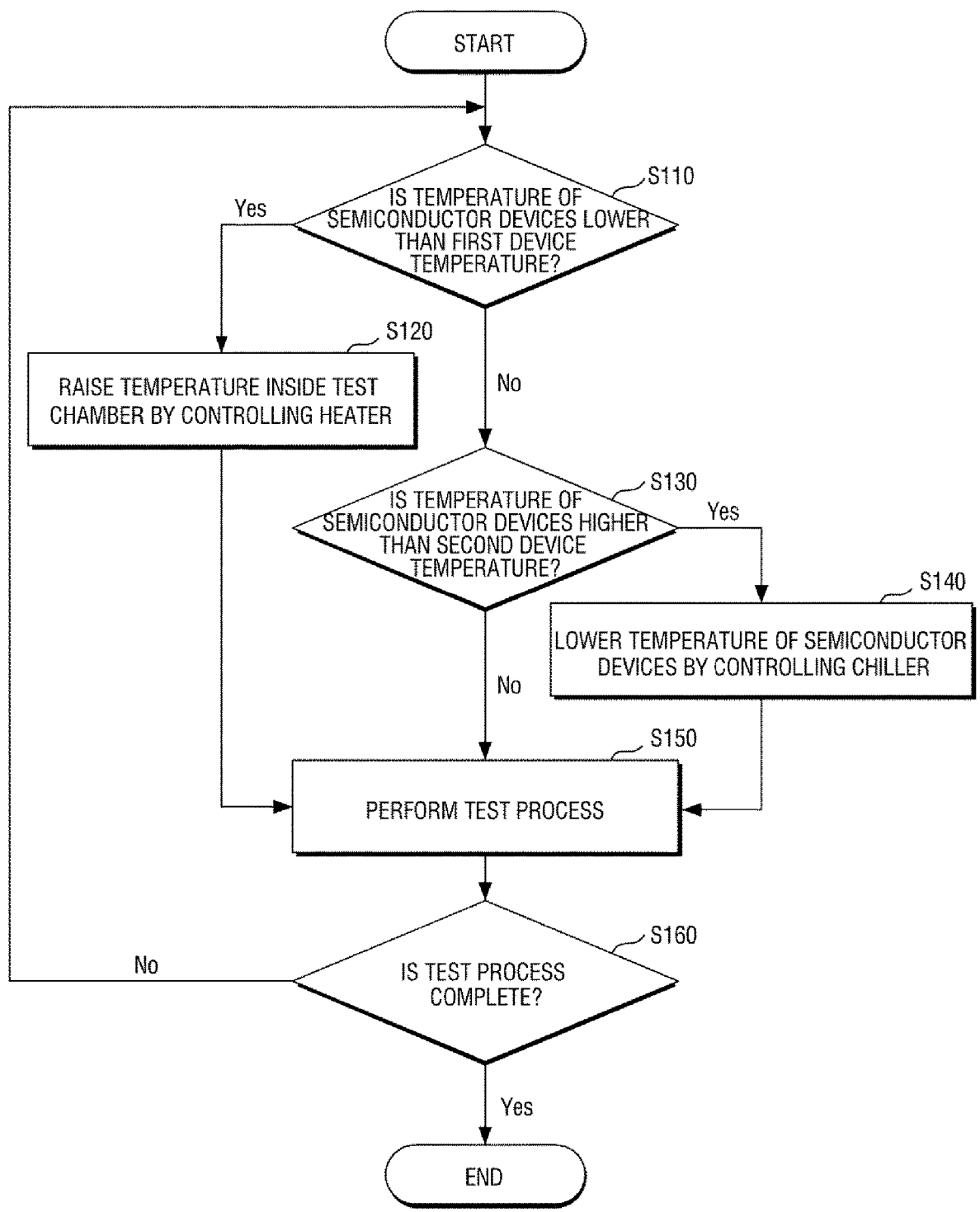
FIG. 8 is a flowchart illustrating how the apparatus of FIG. 1 controls temperature during a high-temperature process.

FIG. 8 is a flowchart illustrating how the apparatus of FIG. 1 controls temperature during a high-temperature process. FIG. 9 is a flowchart illustrating how the apparatus of FIG. 1 controls temperature during a low-temperature process.

Referring to FIGS. 2 and 8, the soak chamber 110 may provide the first and second semiconductor devices 60 and 70 heated to a temperature (e.g., of 80° C.) to the test chamber 120 if a test process for the first and second semiconductor devices 60 and 70 is performed at a high temperature of 80° C. or higher.

The controller 50 may control the temperature of the first and second semiconductor devices 60 and 70 within a predefined temperature range. The controller 50 may control the temperature of the first and second semiconductor devices 60 and 70 in a range from the first device temperature to the second device temperature. For example, the first device temperature may be 82° C. and the second device temperature may be 88° C.

In this case, the controller 50 may sense the temperature of the first and second semiconductor devices 60 and 70 using temperature sensors 62 of the first and second semiconductor devices 60 and 70.

In step S110, the controller 50 may determine whether the temperature of the first and second semiconductor devices 60 and 70 is lower than the first device temperature (for example, 82° C.).

In step S120, the controller 50 may raise the temperature inside the test chamber 120 by controlling the second heater 122 if the temperature of the first and second semiconductor devices 60 and 70 is lower than the first device temperature (for example, 82° C.). In step S150, the test process is performed if the first and second semiconductor devices 60 and 70 are heated above the first device temperature (for example, 82° C.) by the second heater 122.

In step S130, the controller 50 may determine whether the temperature of the first and second semiconductor devices 60 and 70 is higher than the second device temperature (for example, 88° C.) if the temperature of the first and second semiconductor devices 60 and 70 is higher than the first device temperature (for example, 82° C.).

In step S140, the controller 50 may lower the temperature of the first and second semiconductor devices 60 and 70 by controlling the chiller 30 if the temperature of the first and second semiconductor devices 60 and 70 is higher than the second device temperature (for example, 88° C.). For example, the controller 50 may provide cool air with a temperature of 10° C. to the first through fourth nozzles 161 through 164 by controlling the cool air supply 32 of the chiller 30. The first through fourth nozzles 161 through 164 may lower the temperature of the first and second semiconductor devices 60 and 70 by discharging the cool air directly to the first and second semiconductor devices 60 and 70.

In step S150, the test process is performed if the temperature of the first and second semiconductor devices 60 and 70 is lowered below the second device temperature (for example, 88° C.) by the first through fourth nozzles 161 through 164.

In step S160, the controller 50 may determine whether the test process has been completed.

If the test process is still being performed, the controller 50 may repeat steps S110, S120, S130, S140, and S150 so the temperature of the first and second semiconductor devices 60 and 70 is maintained between the first device temperature (for example, 82° C.) and the second device temperature (for example, 88° C.) until the test process is completed.

Figure 9:
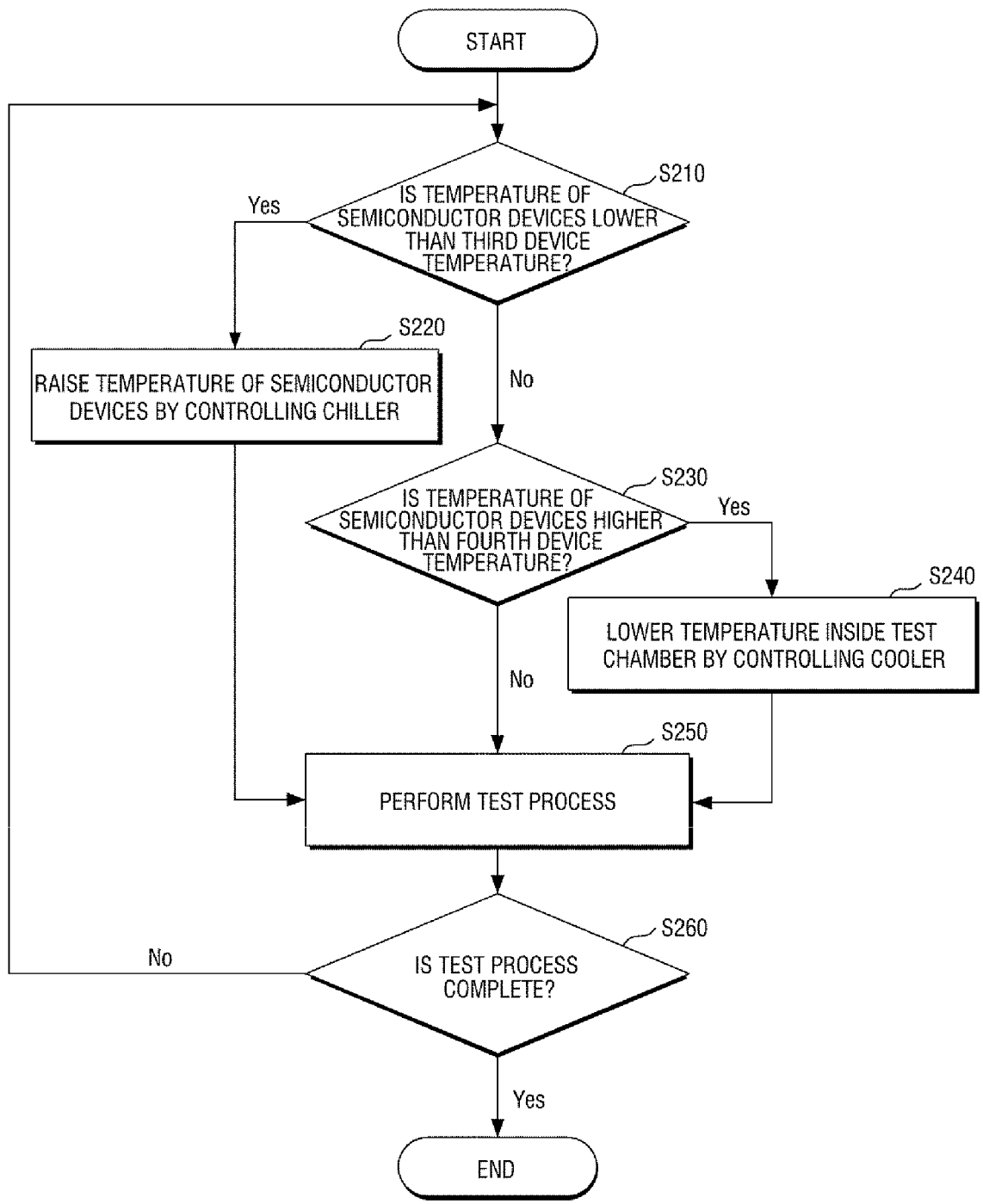
FIG. 9 is a flowchart illustrating how the apparatus of FIG. 1 controls temperature during a low-temperature process.

Referring to FIGS. 2 and 9, if a test process for the first and second semiconductor devices 60 and 70 is performed at a high temperature of −20° C. or lower, the soak chamber 110 may provide the first and second semiconductor devices 60 and 70 cooled to a temperature of −20° C. to the test chamber 120.

The controller 50 may control the temperature of the first and second semiconductor devices 60 and 70 within a predefined temperature range. The controller 50 may control the temperature of the first and second semiconductor devices 60 and 70 in the range from the third device temperature (for example, −28° C.) to the fourth device temperature (for example, 22° C.).

In this case, the controller 50 may sense the temperature of the first and second semiconductor devices 60 and 70 using the temperature sensors 62 of the first and second semiconductor devices 60 and 70.

In step S210, the controller 50 may determine whether the temperature of the first and second semiconductor devices 60 and 70 is lower than the third device temperature (for example, −28° C.).

In step S220, the controller 50 may raise the temperature inside the test chamber 120 by controlling the chiller 30 if the temperature of the first and second semiconductor devices 60 and 70 is lower than the third device temperature (of, for example, −28° C.). For example, the controller 50 may provide cool air with a temperature of 10° C. to the first through fourth nozzles 161 through 164 by controlling the cool air supply 32 of the chiller 30. The first through fourth nozzles 161 through 164 may raise the temperature of the first and second semiconductor devices 60 and 70 by discharging the cool air directly to the first and second semiconductor devices 60 and 70.

In step S250, the test process is performed if the temperature of the first and second semiconductor devices 60 and 70 is raised above the third device temperature (for example, −28° C.) by the first through fourth nozzles 161 through 164.

In step S230, the controller 50 may determine whether the temperature of the first and second semiconductor devices 60 and 70 is higher than the fourth device temperature (for example, −22° C.) if the temperature of the first and second semiconductor devices 60 and 70 is higher than the third device temperature (for example, −28° C.).

In step S240, the controller 50 may lower the temperature inside the test chamber 120 by controlling the second cooler 121 if the temperature of the first and second semiconductor devices 60 and 70 is higher than the fourth device temperature (for example, −22° C.). In step, S250, the test process is performed if the temperature of the first and second semiconductor devices 60 and 70 is lowered below the fourth device temperature (for example, −22° C.).

The controller 50 may determine whether the test process has been completed (S260).

If the test process is still being performed, the controller 50 may repeat steps S210, S220, S230, S240, and S250 so that the temperature of the first and second semiconductor devices 60 and 70 is maintained between the third device temperature (for example, −28° C.) and the fourth device temperature (for example, −22° C.) until the test process is completed.

The apparatus of FIG. 1 can control the temperature of each semiconductor device by discharging air directly to each semiconductor device via a plurality of nozzles disposed in the test chamber 120.

An apparatus for testing a semiconductor device according to some embodiments of the present disclosure will hereinafter be described with reference to FIG. 10. The apparatus of FIG. 10 will hereinafter be described, focusing mainly on the differences with the apparatus of FIG. 5.

Figure 10:
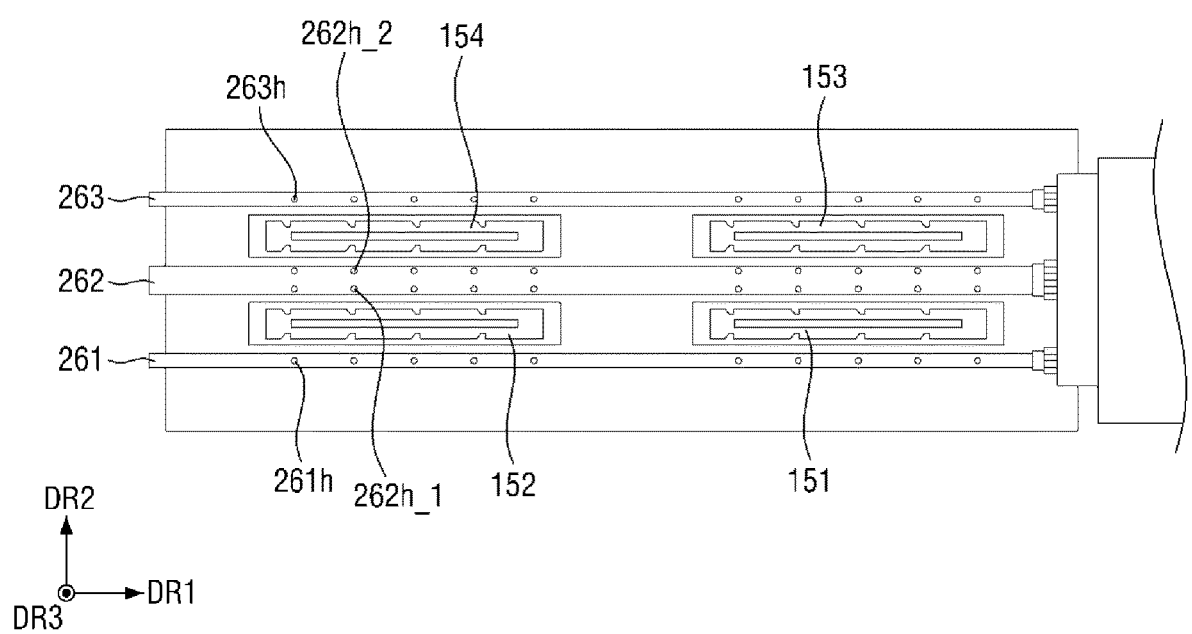
FIG. 10 is a plan view illustrating nozzles disposed in an apparatus for testing a semiconductor device according to some embodiments of the present disclosure.

FIG. 10 is a plan view illustrating nozzles disposed in an apparatus for testing a semiconductor device according to some embodiments of the present disclosure.

Referring to FIG. 10, the apparatus may include first through third nozzles 261 through 263, which are disposed in a test chamber (120 of FIG. 4).

The first nozzle 261 may extend in a first direction DR1 on first sides of first and second storages 151 and 152. The first nozzle 261 may include a plurality of first air outlets 261h. The first air outlets 261h are arranged in a row in the first direction DR1 to be spaced apart from one another.

The second nozzle 162 may extend in the first direction DR1 between the first storage 151 and a third storage 153 and between the second storage 152 and a fourth storage 154.

The second nozzle 262 may include second air outlets 262h_1 and third air outlets 262h_2. The second air outlets 262h_1 may be arranged in a row in the first direction DR1 to be spaced apart from one another. The third air outlets 262h_2 may be spaced apart from the second air outlets 262h_1. Additionally, the third air outlets 262h_2 may be arranged in a row in the first direction DR1 to be spaced apart from one another.

The second air outlets 262h_1 may be formed adjacent to the first and second storages 151 and 152. The second air outlets 262h_1 may provide air directly to the first and second storages 151 and 152.

The third air outlets 262h_2 may be formed adjacent to the third and fourth storages 153 and 154. The third air outlets 262h_2 may provide air directly to the third and fourth storages 153 and 154.

The third nozzle 263 may extend in the first direction on first sides of the third and fourth storages 153 and 154. The third nozzle 263 may include a plurality of fourth air outlets 263h. The plurality of fourth air outlets 263h are arranged in a row in the first direction DR1 to be spaced apart from one another.

An apparatus for testing a semiconductor device according to some embodiments of the present disclosure will hereinafter be described with reference to FIG. 11. The apparatus of FIG. 11 will hereinafter be described, focusing mainly on the differences with the apparatus of FIG. 5.

Figure 11:
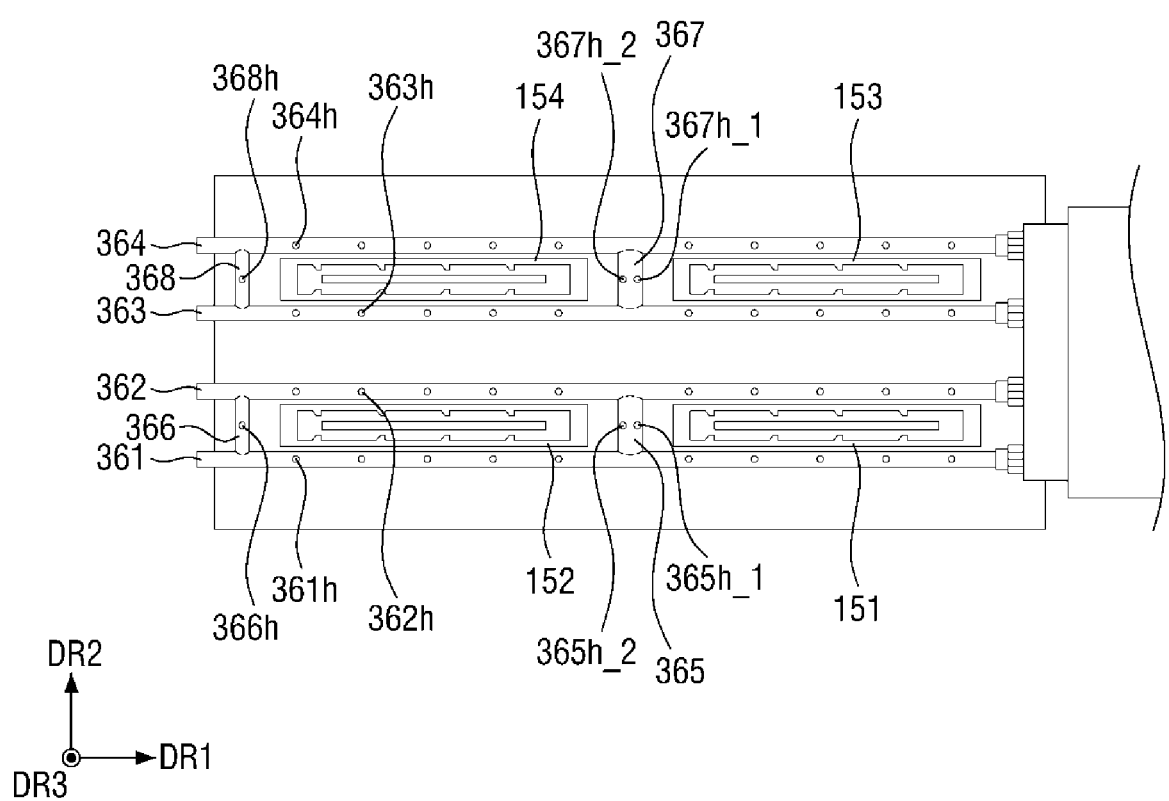
FIG. 11 is a plan view illustrating nozzles disposed in an apparatus for testing a semiconductor device according to some embodiments of the present disclosure.

FIG. 11 is a plan view illustrating nozzles disposed in an apparatus for testing a semiconductor device according to some embodiments of the present disclosure.

Referring to FIG. 11, the apparatus may include first through eighth nozzles 361 through 368, which are disposed in a test chamber (120 of FIG. 4).

The first nozzle 361 may extend in a first direction DR1 on first sides of first and second storages 151 and 152. The first nozzle 361 may include a plurality of first air outlets 361h. The plurality of first air outlets 361h are arranged in a row in the first direction DR1 to be spaced apart from one another.

The second nozzle 362 may extend in the first direction DR1 on second sides of the first and second storages 151 and 152. The second nozzle 362 may include a plurality of second air outlets 362h. The plurality of second air outlets 362h are arranged in a row in the first direction DR1 to be spaced apart from one another.

The third nozzle 363 may extend in the first direction DR1 on first sides of third and fourth storages 153 and 154. The third nozzle 363 may include a plurality of third air outlets 363h. The plurality of third air outlets 363h are arranged in a row in the first direction DR1 to be spaced apart from one another.

The fourth nozzle 364 may extend in the first direction DR1 on second sides of the third and fourth storages 153 and 154. The fourth nozzle 364 may include a plurality of fourth air outlets 364h. The plurality of fourth air outlets 364h are arranged in a row in the first direction DR1 to be spaced apart from one another.

The fifth nozzle 365 may extend in a second direction DR2 between the first and second storages 151 and 152. The fifth nozzle 365 may be connected to the first and second nozzles 361 and 362. The fifth nozzle 365 may be disposed adjacent to the first storage 151 and may include fifth air outlets 365h_1. The fifth air outlets 365h_1 provide air directly to the first storage 151. Additionally, the fifth nozzle 365 may be disposed adjacent to the second storage 152 and may include sixth air outlets 365h_2. The sixth air outlets 365h_2 provide air directly to the second storage 152.

The sixth nozzle 366 may extend in the second direction DR2 to be connected to end portions of the first and second nozzles 361 and 362. The sixth nozzle 366 may include seventh air outlets 366h, which provide air directly to the second storage 152.

The seventh nozzle 367 may extend in the second direction DR2 between the third and fourth storages 153 and 154. The seventh nozzle 367 may be connected to the third and fourth nozzles 363 and 364. The seventh nozzle 367 may be disposed adjacent to the third storage 153 and may include eighth air outlets 367h_1. The eighth air outlets 367h_1 provide air directly to the third storage 153. Additionally, the seventh nozzle 367 may be disposed adjacent to the fourth storage 154 and may include ninth air outlets 367h_2. The ninth air outlets 367h_2 provide air directly to the fourth storage 154.

The eighth nozzle 368 may extend in the second direction DR2 to be connected to end portions of the third and fourth nozzles 363 and 364. The eighth nozzle 368 may include tenth air outlets 368h, which provide air directly to the fourth storage 154.

An apparatus for testing a semiconductor device according to some embodiments of the present disclosure will hereinafter be described with reference to FIG. 12. The apparatus of FIG. 12 will hereinafter be described, focusing mainly on the differences with the apparatus of FIG. 5.

Figure 12:
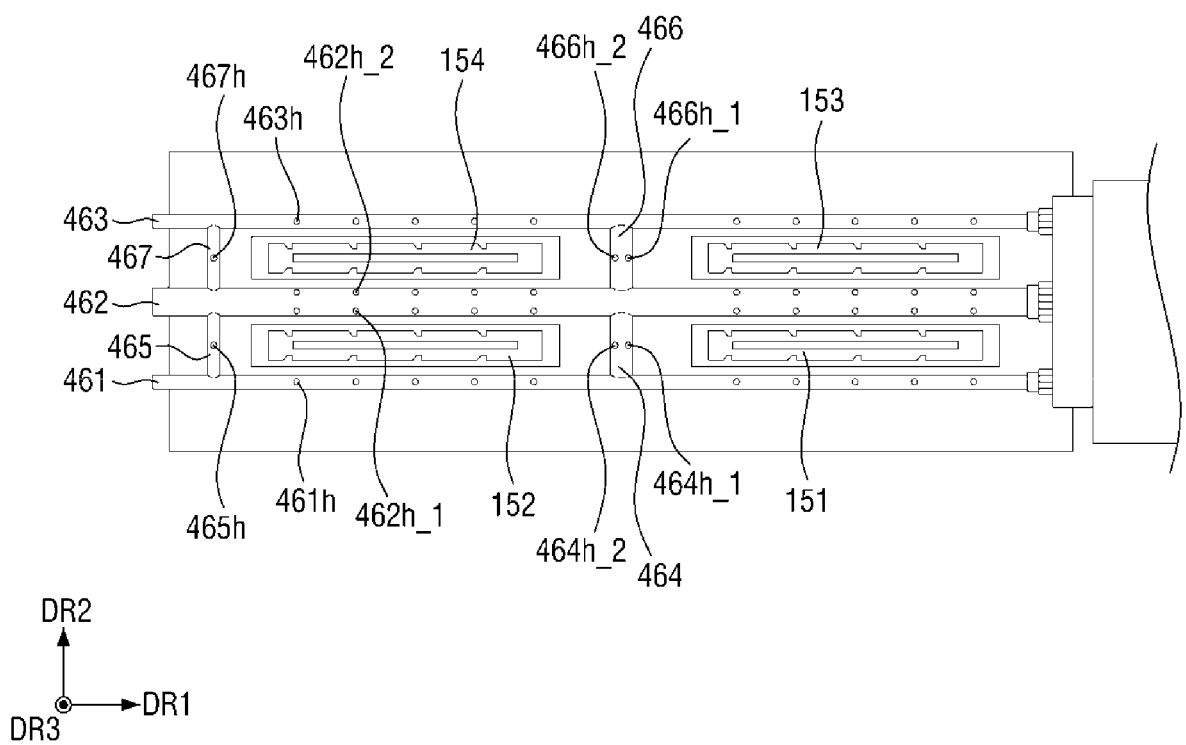
FIG. 12 is a plan view illustrating nozzles disposed in an apparatus for testing a semiconductor device according to some embodiments of the present disclosure.

FIG. 12 is a plan view illustrating nozzles disposed in an apparatus for testing a semiconductor device according to some embodiments of the present disclosure.

Referring to FIG. 12, the apparatus may include first through seventh nozzles 461 through 467, which are disposed in a test chamber (120 of FIG. 4).

The first nozzle 461 may extend in a first direction DR1 on first sides of first and second storages 151 and 152. The first nozzle 461 may include a plurality of first air outlets 461h. The plurality of first air outlets 461h are arranged in a row in the first direction DR1 to be spaced apart from one another.

The second nozzle 462 may extend in the first direction DR1 between the first storage 151 and a third storage 153 and between the second storage 152 and a fourth storage 154.

The second nozzle 462 may include second air outlets 462h_1 and third air outlets 462h_2. The second air outlets 462h_1 may be arranged in a row in the first direction DR1 to be spaced apart from one another. The third air outlets 462h_2 may be spaced apart from the second air outlets 462h_1. The third air outlets 462h_2 may be arranged in a row in the first direction DR1 to be spaced apart from one another.

The second air outlets 462h_1 may be disposed adjacent to the first and second storages 151 and 152. The second air outlets 462h_1 may provide air directly to the first and second storages 151 and 152.

The third air outlets 463h_1 may be disposed adjacent to the third and fourth storages 153 and 154. The third air outlets 463h_1 may provide air directly to the third and fourth storages 153 and 154.

The third nozzle 463 may extend in the first direction DR1 on first sides of the third and fourth storages 153 and 154. The third nozzle 463 may include a plurality of fourth air outlets 463h. The plurality of fourth air outlets 463h are arranged in a row in the first direction DR1 to be spaced apart from one another.

The fourth nozzle 464 may extend in a second direction DR2 between the first and second storages 151 and 152. The fourth nozzle 464 may be connected to the first and second nozzles 461 and 462. The fourth nozzle 464 may be disposed adjacent to the first storage 151 and may include fifth air outlets 464h_1, which provide air directly to the first storage 151. Additionally, the fourth nozzle 464 may be disposed adjacent to the second storage 152 and may include sixth air outlets 464h_2. The sixth air outlets 464h_2 may provide air directly to the second storage 152.

The fifth nozzle 465 may extend in the second direction DR2 to be connected to end portions of the first and second nozzles 461 and 462. The fifth nozzle 465 may include seventh air outlets 465h, which provide air directly to the second storage 152.

The sixth nozzle 466 may extend in the second direction DR2 between the third and fourth storages 153 and 154. The sixth nozzle 466 may be connected to the second and third nozzles 462 and 463. The sixth nozzle 466 may be disposed adjacent to the third storage 153 and may include eighth air outlets 466h_1, which provide air directly to the third storage 153. Additionally, the sixth nozzle 466 may be disposed adjacent to the fourth storage 154 and may include ninth air outlets 466h_2, which provide air directly to the fourth storage 154.

The seventh nozzle 467 may extend in the second direction DR2 to be connected to end portions of the second and third nozzles 462 and 463. The seventh nozzle 467 may include tenth air outlets 467h, which provide air directly to the fourth storage 154.

While embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further embodiments of the present disclosure.

What is claimed is:

1. An apparatus for testing a semiconductor device, comprising:
    a test chamber in which a test process for a plurality of semiconductor devices is performed;
    a first storage disposed in the test chamber and configured to hold a first semiconductor device located therein;
    a second storage disposed in the test chamber and spaced apart in a first direction from the first storage and configured to hold a second semiconductor device located therein;
    a first nozzle extending in the first direction on a first side of the first storage and a first side of the second storage and including a plurality of first air outlets configured to discharge air, wherein the first side of the first storage and the first side of the second storage extend in the first direction;
    a second nozzle extending in the first direction on a second side of the first storage and a second side of the second storage and including a plurality of second air outlets configured to discharge air, wherein the second side of the first storage and the second side of the second storage extend in the first direction; and
    a controller controlling temperatures of the first and second semiconductor devices within a predefined temperature range by controlling the air discharged by the first and second nozzles.

2. The apparatus of claim 1, further comprising:
    a third storage spaced apart from the first storage in a second direction, which is different from the first direction, and configured to hold a third semiconductor device located therein.

3. The apparatus of claim 2, further comprising:
    a third nozzle extending in the first direction, located on a first side of the third storage, and including a plurality of third air outlets configured to discharge air; and
    a fourth nozzle extending in the first direction, located on a second side of the third storage, and including a plurality of fourth air outlets configured to discharge air.

4. The apparatus of claim 1, wherein the plurality of first air outlets are spaced apart in the first direction and the plurality of second air outlets are spaced apart in the first direction.

5. The apparatus of claim 1, further comprising:
    a chiller providing air cooled with a first coolant having a first coolant temperature to the first and second nozzles.

6. The apparatus of claim 5, further comprising:
    a heater heating the inside of the test chamber;
    a cooler cooling the inside of the test chamber; and
    fans providing air heated by the heater or air cooled by the cooler to the inside of the test chamber,
    wherein the chiller provides a second coolant having a second coolant temperature, which is lower than the first coolant temperature, to the cooler, and
    the cooler cools air using the second coolant.

7. The apparatus of claim 1, wherein if the test process is performed at a temperature of 80° C. or higher, the controller controls the temperature of the first semiconductor device within a range from a first device temperature to a second device temperature.

8. The apparatus of claim 7, wherein
if the temperature of the first semiconductor device becomes lower than the first device temperature, the controller raises the temperature inside the test chamber, and
if the temperature of the first semiconductor device becomes higher than the second device temperature, the controller lowers the temperature of the first semiconductor device using the first and second nozzles.

9. The apparatus of claim 1, wherein if the test process is performed at a temperature of −20° C. or lower, the controller controls the temperature of the first semiconductor device within a range from a third device temperature to a fourth device temperature.

10. The apparatus of claim 9, wherein
if the temperature of the first semiconductor device becomes lower than the third device temperature, the controller raises the temperature of the first semiconductor device using the first and second nozzles, and
if the temperature of the first semiconductor device becomes higher than the fourth device temperature, the controller lowers the temperature inside the test chamber.

11. An apparatus for testing a semiconductor device, comprising:
a test chamber in which a test process for a plurality of semiconductor devices is performed;
a first storage disposed in the test chamber and configured to hold a first semiconductor device located therein;
a second storage disposed in the test chamber and spaced apart in a first direction from the first storage, and having a second semiconductor device located therein,
a first nozzle extending in the first direction on a first side of the first storage and a first side of the second storage and providing air directly to the first semiconductor device, wherein the first side of the first storage and the first side of the second storage extend in the first direction;
a second nozzle extending in the first direction on a second side of the first storage and a second side of the second storage and providing air directly to the first semiconductor device wherein the second side of the first storage and the second side of the second storage extend in the first direction;
a heater heating the inside of the test chamber;
a cooler cooling the inside of the test chamber;
a chiller providing air cooled with a first coolant having a first coolant temperature to the first and second nozzles; and
a controller controlling temperature of the first semiconductor device within a predefined temperature range by controlling the heater, the cooler, and the chiller,
wherein the second storage is disposed between the first and second nozzles.

12. The apparatus of claim 11, wherein
the chiller provides a second coolant having a second coolant temperature, which is lower than the first coolant temperature, and
the cooler cools air using the second coolant.

13. The apparatus of claim 11, further comprising:
fans providing air heated by the heater or air cooled by the cooler to the inside of the test chamber.

14. The apparatus of claim 11, wherein
the first and second nozzles provide air directly to the second semiconductor device.

15. The apparatus of claim 11, further comprising:
a third storage spaced apart from the first storage in a second direction, which is different from the first direction, and configured to hold a third semiconductor device located therein.

16. The apparatus of claim 15, further comprising:
a third nozzle extending in the first direction on a first side of the third storage and providing air directly to the third semiconductor device; and
a fourth nozzle extending in the first direction on a second side of the third storage and providing air directly to the third semiconductor device.

17. The apparatus of claim 11, wherein
the first nozzle includes a plurality of first air outlets, which are spaced apart from one another in the first direction and discharge air, and
the second nozzle includes a plurality of second air outlets, which are spaced apart from one another in the first direction and discharge air.

18. An apparatus for testing a semiconductor device, comprising:
a test chamber in which a test process for a plurality of semiconductor devices is performed;
a first storage disposed in the test chamber and configured to hold a first semiconductor device located therein;
a second storage disposed in the test chamber and spaced apart in a first direction from the first storage and configured to hold a second semiconductor device located therein;
a third storage disposed in the test chamber and spaced apart from the first storage in a second direction, which is different from the first direction, and configured to hold a third semiconductor device located therein;
a first nozzle extending in the first direction on a first side of the first storage and a first side of the second storage and including a plurality of first air outlets configured to discharge air, wherein the first side of the first storage and the first side of the second storage extend in the first direction;
a second nozzle extending in the first direction on a second side of the first storage and a second side of the second storage and including a plurality of second air outlets configured to discharge air, wherein the second side of the first storage and the second side of the second storage extend in the first direction;
a third nozzle extending in the first direction on a first side of the third storage and including a plurality of third air outlets configured to discharge air;
a fourth nozzle extending in the first direction on a second side of the third storage and including a plurality of fourth air outlets configured to discharge air;
a heater heating the inside of the test chamber;
a cooler cooling the inside of the test chamber;
a chiller providing air cooled with a first coolant having a first coolant temperature to the first through fourth nozzles; and
a controller controlling temperatures of the first through third semiconductor devices within a predefined temperature range by controlling the heater, the cooler, and the chiller.

19. The apparatus of claim 18, wherein if the test process is performed at a temperature of 80° C. or higher, the controller controls the temperature of the first semiconductor device within a range from a first device temperature to a second device temperature,
if the temperature of the first semiconductor device becomes lower than the first device temperature, the controller raises the temperature inside the test chamber by controlling the heater, and if the temperature of the first semiconductor device becomes higher than the second device temperature, the controller lowers the temperature of the first semiconductor device by controlling the chiller.

20. The apparatus of claim 18, wherein if the test process is performed at a temperature of −20° C. or lower, the controller controls the temperature of the first semiconductor device within a range from a third device temperature to a fourth device temperature, if the temperature of the first semiconductor device becomes lower than the third device temperature, the controller raises the temperature inside the test chamber by controlling the chiller, and if the temperature of the first semiconductor device becomes higher than the fourth device temperature, the controller lowers the temperature inside the test chamber by controlling the cooler.

* * * * *